(12) United States Patent
Chao et al.

(10) Patent No.: US 11,748,111 B2
(45) Date of Patent: *Sep. 5, 2023

(54) BASIC INPUT OUTPUT SYSTEM (BIOS)—IDENTIFY MEMORY SIZE OR NODE ADDRESS RANGE MIRRORING SYSTEM

(71) Applicant: Dell Products L.P., Round Rock, TX (US)

(72) Inventors: Ching-Lung Chao, Austin, TX (US); Shih-Hao Wang, Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/589,737

(22) Filed: Jan. 31, 2022

(65) Prior Publication Data

US 2022/0156089 A1    May 19, 2022

Related U.S. Application Data

(63) Continuation of application No. 16/940,098, filed on Jul. 27, 2020, now Pat. No. 11,294,692.

(51) Int. Cl.
*G06F 9/4401* (2018.01)
*G06F 12/02* (2006.01)
(Continued)

(52) U.S. Cl.
CPC ........ *G06F 9/4406* (2013.01); *G06F 9/30189* (2013.01); *G06F 9/4411* (2013.01); *G06F 12/0238* (2013.01); *G06F 2212/2542* (2013.01); *G11C 16/10* (2013.01); *G11C 16/32* (2013.01); *H01L 25/0657* (2013.01)

(58) Field of Classification Search
CPC .... G06F 9/4406; G06F 3/0614; G06F 3/0679; G11C 16/10; G11C 16/32; H01C 16/32
See application file for complete search history.

(56) References Cited

U.S. PATENT DOCUMENTS

| 10,353,609 | B2 * | 7/2019 | Xie | G06F 3/0673 |
| 10,824,524 | B2 * | 11/2020 | Koladi | G06F 11/2058 |
| 2012/0054543 | A1 * | 3/2012 | Dreier | G06F 11/1666 714/6.23 |

\* cited by examiner

*Primary Examiner* — Tammara R Peyton
(74) *Attorney, Agent, or Firm* — Joseph Mencher

(57) ABSTRACT

An address range mirroring system includes a plurality of processing subsystem/memory subsystem nodes that each include a respective processing subsystem coupled to a respective memory subsystem, an operating system provided by at least one of the plurality of processing subsystem/memory subsystem nodes, and a Basic Input/Output System (BIOS) that is coupled to the plurality of processing subsystem/memory subsystem nodes. The BIOS identifies an address range mirroring memory size that was provided by the operating system, and an address range mirroring node usage identification that was provided by the operating system. The BIOS then configures address range mirroring according to the address range mirroring memory size in the respective memory subsystem in each of a subset of the plurality of processing subsystem/memory subsystem nodes, with the subset of the plurality of processing subsystem/memory subsystem nodes based on the address range mirroring node usage identification.

20 Claims, 7 Drawing Sheets

(51) Int. Cl.
  *G06F 9/30*    (2018.01)
  *G11C 16/10*   (2006.01)
  *G11C 16/32*   (2006.01)
  *H01L 25/065*  (2023.01)

BASIC INPUT OUTPUT SYSTEM (BIOS)—IDENTIFY MEMORY SIZE OR NODE ADDRESS RANGE MIRRORING SYSTEM

CROSS-REFERENCE TO RELATED APPLICATIONS

The present disclosure is a continuation of U.S. patent application Ser. No. 16/940,098, filed on Jul. 27, 2020, the disclosure of which is incorporated by reference herein in its entirety.

BACKGROUND

The present disclosure relates generally to information handling systems, and more particularly to address range mirroring in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, may utilize address range mirroring in order to protect relatively important data. As would be understood by one of skill in the art in possession of the present disclosure, address range mirroring may be utilized to provide for the "mirroring" or copying of data stored in a portion of a memory system (i.e., as compared to "full" memory mirroring that mirrors entire memory devices.) For example, an operating system in the server device may provide a request for address range mirroring, and a BIOS will then operate to configure address range mirroring in first and second portions of the memory system for use by the operating system in storing important data. Subsequently, the operating system may store data in that first portion of the memory system, and the processing system will operate to automatically provide a copy of that data in the second portion of the memory system. However, address range mirroring can raise issues when utilized with some memory system configurations.

For example, a processing system in a server device may include multiple processor subsystems coupled together by processor interconnect(s) (e.g., an Ultra Path Interconnect (UPI) provided in processing systems available from INTEL® Corporation of Santa Clara, Calif., United States), with the memory system in that server device providing a respective memory subsystem for each processor subsystem (with each respective memory subsystem often called the "local memory" for its associated processor subsystem), and the processing system/memory system configured in a Non-Uniform Memory Access (NUMA) design in which the memory access time depends on the memory subsystem location relative to the processor subsystem, with processor subsystems capable of accessing their local memory subsystem faster than non-local memory subsystems (i.e., the memory subsystem that is local to the other processor subsystem(s)). In such NUMA configurations, multiple processing subsystem/memory subsystem "nodes" may be provided by the processing subsystem/memory subsystem combinations discussed above, and conventional address range mirroring systems operate to configure address range mirroring in the first/second portions of the memory subsystem in each of the processing subsystem/memory subsystem nodes, thus requiring a second portion of each of those memory subsystems to be reserved for redundant data. However, in some situations, address range mirroring may not be required in all of the processing subsystem/memory subsystem nodes, and thus conventional address range mirroring systems operate to waste memory space in such situations.

Accordingly, it would be desirable to provide an address range mirroring system that addresses the issues discussed above.

SUMMARY

According to one embodiment, an Information Handling System (IHS) includes a Basic Input/Output (BIOS) processing system; and a BIOS memory system that is coupled to the BIOS processing system and that includes instructions that, when executed by the BIOS processing system, cause the BIOS processing system to provide a BIOS engine that is configured to: identify an address range mirroring memory size that was received from an operating system provided by at least one of a plurality of processing subsystem/memory subsystem nodes that each include a respective processing subsystem coupled to a respective memory subsystem; identify an address range mirroring node usage identification that was received from the operating system; and configure address range mirroring according to the address range mirroring memory size in the respective memory subsystem in each of a subset of the plurality of processing subsystem/memory subsystem nodes, wherein the subset of the plurality of processing subsystem/memory subsystem nodes is based on the address range mirroring node usage identification.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
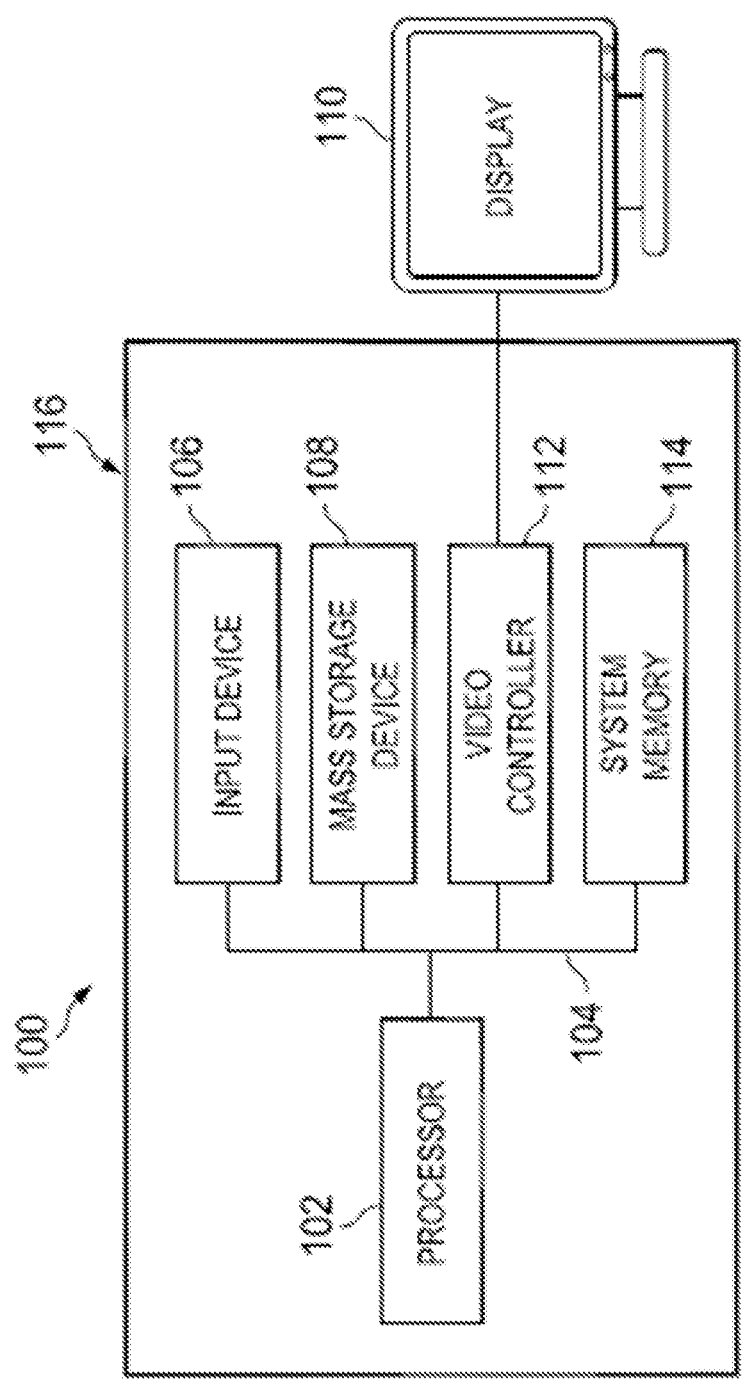
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
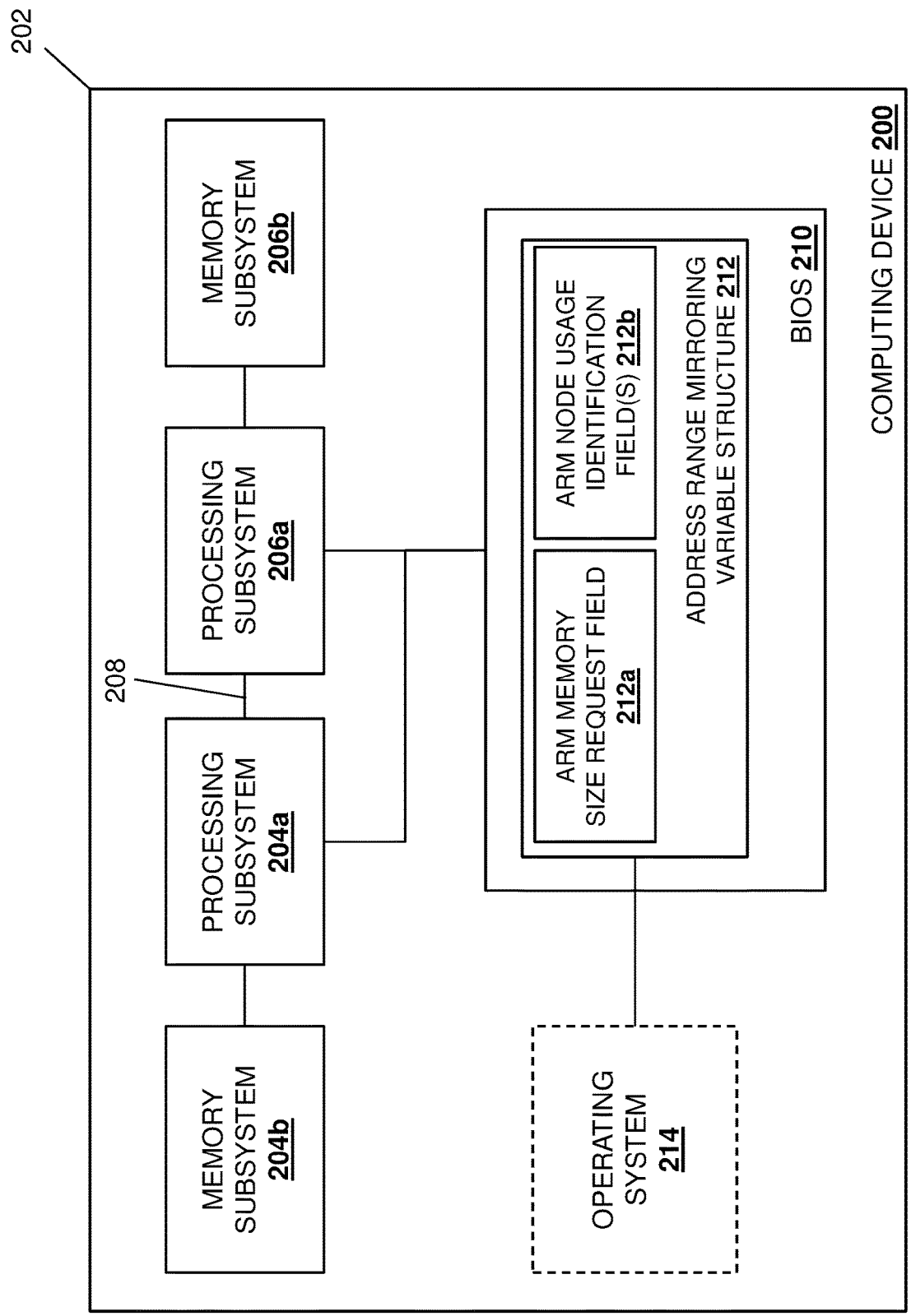
FIG. 2 is a schematic view illustrating an embodiment of a computing device that includes the address range mirroring system of the present disclosure.

Referring now to FIG. 2, an embodiment of a computing device 200 is illustrated that includes the address range mirroring system of the present disclosure. In an embodiment, the computing device 200 may be provided by the IHS 100 discussed above with reference to FIG. 1 and/or may include some or all of the components of the IHS 100. While one of skill in the art in possession of the present disclosure will recognize that the computing device is illustrated and discussed below as being provided by a server device, one of skill in the art in possession of the present disclosure will recognize that the functionality of the computing device 200 discussed below may be provided by networking devices, desktop computing devices, laptop/notebook computing devices, tablet devices, mobile phones, and/or other devices that are configured to operate similarly as the computing device 200 discussed below. In the illustrated embodiment, the computing device 200 includes a chassis 202 that houses the components of the computing device 200, only some of which are illustrated below.

In the illustrated example, the chassis 202 houses a processing system that is provided by a dual-processor system including the processing subsystem 204a and the processing subsystem 206a that are coupled together by a processing subsystem interconnect 208 (e.g., the UPI discussed above), and each of which may include one of more processors like the processor 102 discussed above with reference to FIG. 1. However, while a dual-processor system is illustrated and described herein, one of skill in the art in possession of the present disclosure in the art will recognize how the teachings of the present disclosure may be extended to other multi-processor systems that include additional processing subsystems while remaining within the scope of the present disclosure as well.

The chassis 202 may also houses a memory system that provides a local memory subsystem for each of the processing subsystems in the processing system. As such, in the illustrated embodiment, a memory subsystem 204b is provided as the local memory subsystem for the processing subsystem 204a, and a memory subsystem 206b is provided as the local memory subsystem for the processing subsystem 206a. In a specific example, the memory subsystems 204b and 206b may be host memory subsystems provided by any of a variety of memory devices known in the art. In a specific example, the processor subsystem 204a/memory subsystem 204b and the processing subsystem 206a/memory subsystem 206b operate as processing subsystem/memory subsystem nodes that may be provided by Non-Uniform Memory Access (NUMA) nodes, with the processor subsystem 204a/memory subsystem 204b providing a first NUMA node (e.g., "NUMA node 0") and the processor subsystem 206a/memory subsystem 206b providing a second NUMA node (e.g., "NUMA node 1") that is coupled to the first NUMA node via the processing subsystem interconnect/UPI 208. However, while particular processing subsystem/memory subsystem nodes are described in a two processing subsystem/memory subsystem node configuration, one of skill in the art in possession of the present disclosure will recognize that other processing subsystem/memory subsystem node systems will fall within the scope of the present disclosure as well.

As such, one of skill in the art in possession of the present disclosure will recognize that the processing subsystems 204a and 206a and their respective local memory subsystems 204b and 206b illustrated in FIG. 2 provide an example of a NUMA configuration in which local memory subsystems are provided for each processing subsystem in a multi-processor system, and memory subsystem access times depend on the relative location of the memory subsystem and the processing subsystem performing the memory access operations, with processing subsystems able to access their local memory subsystems faster than memory subsystems that are not local (i.e., memory subsystems that are local to another processing subsystem.) However, while a NUMA memory design is illustrated and discussed below, other processing system/memory system configurations may benefit from the teachings of the present disclosure and thus are envisioned as falling within its scope as well.

The chassis 202 also houses a Basic Input/Output System (BIOS) 210 that one of skill in the art in possession of the present disclosure will recognize may be provided by firmware, and used to perform hardware initialization during booting operations (e.g., Power-On StartUp (POST)) for the computing device 200, as well as provide runtime services for an operating systems and/or other applications/programs provided by the computing device 200. As such, the BIOS 210 may be provided by a BIOS processing system (not illustrated, but which may include the processor 102 discussed above with reference to FIG. 1) and a BIOS memory system (not illustrated, but which may be provided by the memory 114 discussed above with reference to FIG. 1) that includes instruction that, when executed by the BIOS processing system, cause the BIOS processing system to provide a BIOS engine that is configured to performs the operations of the BIOS 210 discussed below. Furthermore, while discussed as a BIOS, one of skill in the art in possession of the present disclosure will recognize that the BIOS 210 may be provided according to the Unified Extensible Firmware Interface (UEFI) specification, which defines a software interface between operating systems and platform firmware and which was provided to replace legacy BIOS firmware, while remaining within the scope of the present disclosure as well.

In a specific example, the BIOS 210 may include an address range mirroring variable structure 212 (e.g., an address range mirroring UEFI variable structure) that includes an Address Range Mirroring (ARM) memory size request field 212a along with one or more Address Range Mirroring (ARM) node usage identification fields 212b. In a specific example, each of the Address Range Mirroring (ARM) memory size request field 212a and the one or more Address Range Mirroring (ARM) node usage identification fields 212b may be configured to store UEFI variables, although other fields and/or structures for performing the functionality of the present disclosure will fall within the scope of the present disclosure as well. In some of the examples discussed below, the Address Range Mirroring (ARM) node usage identification fields 212b may be configured to provide for the setting of flags that operate to indicate a number of processing subsystem/memory subsystem nodes upon which address range mirroring is being requested to the BIOS 210. However, while a specific address range mirroring variable structure and Address Range Mirroring (ARM) node usage identification fields are described below, one of skill in the art in possession of the present disclosure will appreciate that a number of processing subsystem/memory subsystem nodes upon which address range mirroring should be performed may be identified in a variety of manners that will fall within the scope of the present disclosure as well.

In the illustrated embodiment, an operating system 214 is illustrated as coupled to the address range mirroring variable structure 212 in the BIOS 210, and one of skill in the art in possession of the present disclosure will recognize that the operating system 214 may be provided by at least one of the processing subsystem/memory subsystem nodes in the computing device 200 (e.g. the processing subsystem 204a and the memory subsystem 204b, the processing subsystem 206a and the memory subsystem 206b, etc.) However, while a specific computing device 200 has been illustrated and described, one of skill in the art in possession of the present disclosure will recognize that computing devices utilizing the address range mirroring system of the present disclosure may include a variety of components and/or component configurations for performing conventional computing device functionality, as well as the functionality discussed below, while remaining within the scope of the present disclosure as well.

Figure 3:
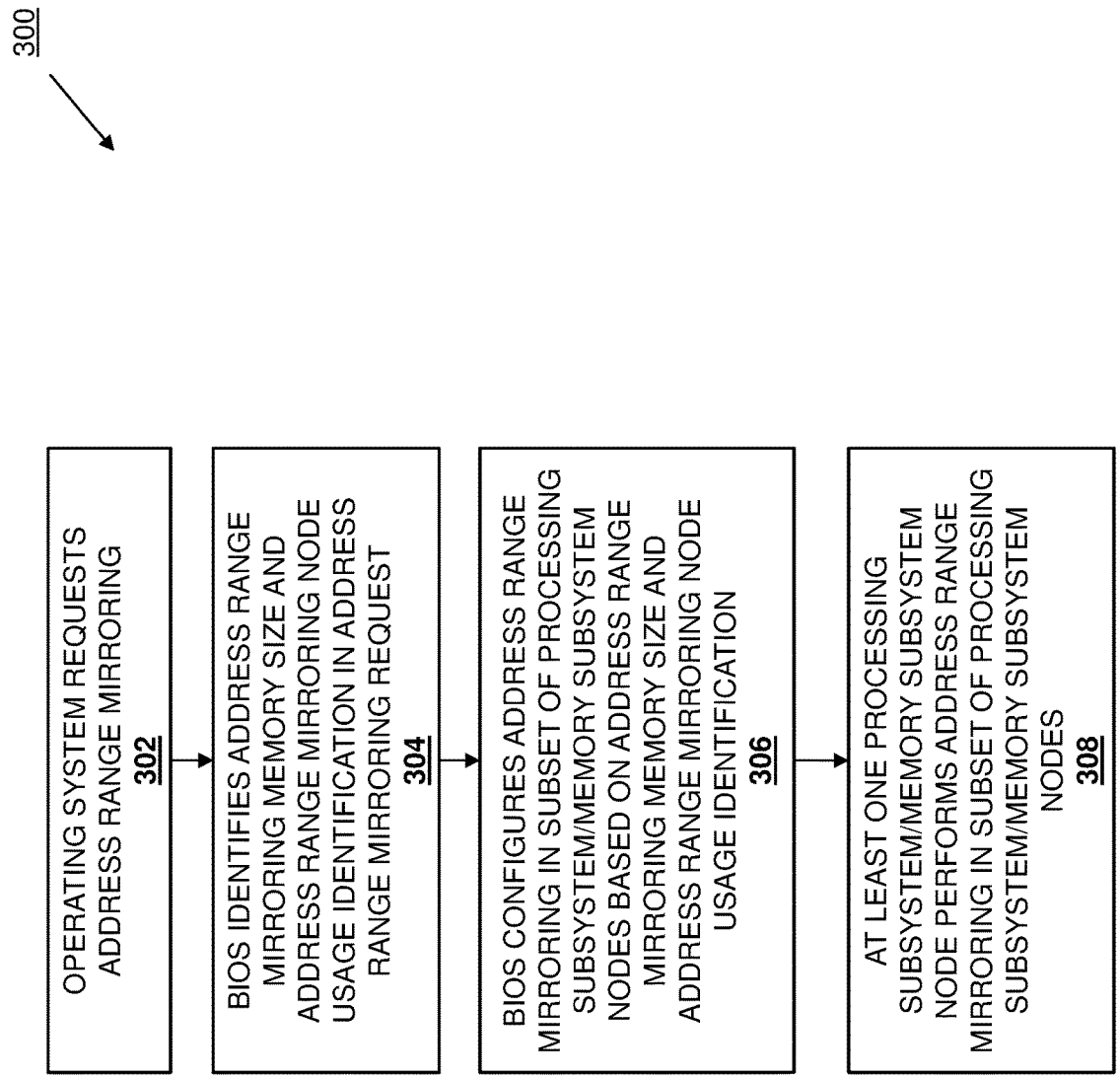
FIG. 3 is a flow chart illustrating an embodiment of a method for performing address range mirroring.

Referring now to FIG. 3, an embodiment of a method 300 for performing address range mirroring is illustrated. As discussed below, the systems and methods of the present disclosure provide for the modification of multi-processing subsystem/memory subsystem node address range mirroring operations by a BIOS that would conventionally operate to configure address range mirroring on the memory subsystem in each of the processing subsystem/memory subsystem nodes in the multi-processing subsystem/memory subsystem node system. For example, the address range mirroring system of the present disclosure may include a plurality of processing subsystem/memory subsystem nodes, each of which include a respective processing subsystem coupled to a respective memory subsystem. An operating system is provided by at least one of the plurality of processing subsystem/memory subsystem nodes, and a BIOS that is coupled to the plurality of processing subsystem/memory subsystem nodes may identify an address range mirroring memory size and an address range mirroring node usage identification that was provided by the operating system. In response, the BIOS will configure address range mirroring according to the address range mirroring memory size in the respective memory subsystem in each of a subset of the plurality of processing subsystem/memory subsystem nodes, with the subset of the plurality of processing subsystem/memory subsystem nodes based on the address range mirroring node usage identification. As such, the number processing subsystem/memory subsystem nodes in a multi-processing subsystem/memory subsystem node system upon which address range mirroring is configured may be modified such that address range mirroring is performed on less than all of the processing subsystem/memory subsystem nodes in the multi-processing subsystem/memory subsystem node system, allowing for the conservation of memory resources in situations where address range mirroring is not required on all of the processing subsystem/memory subsystem nodes.

Figure 4:
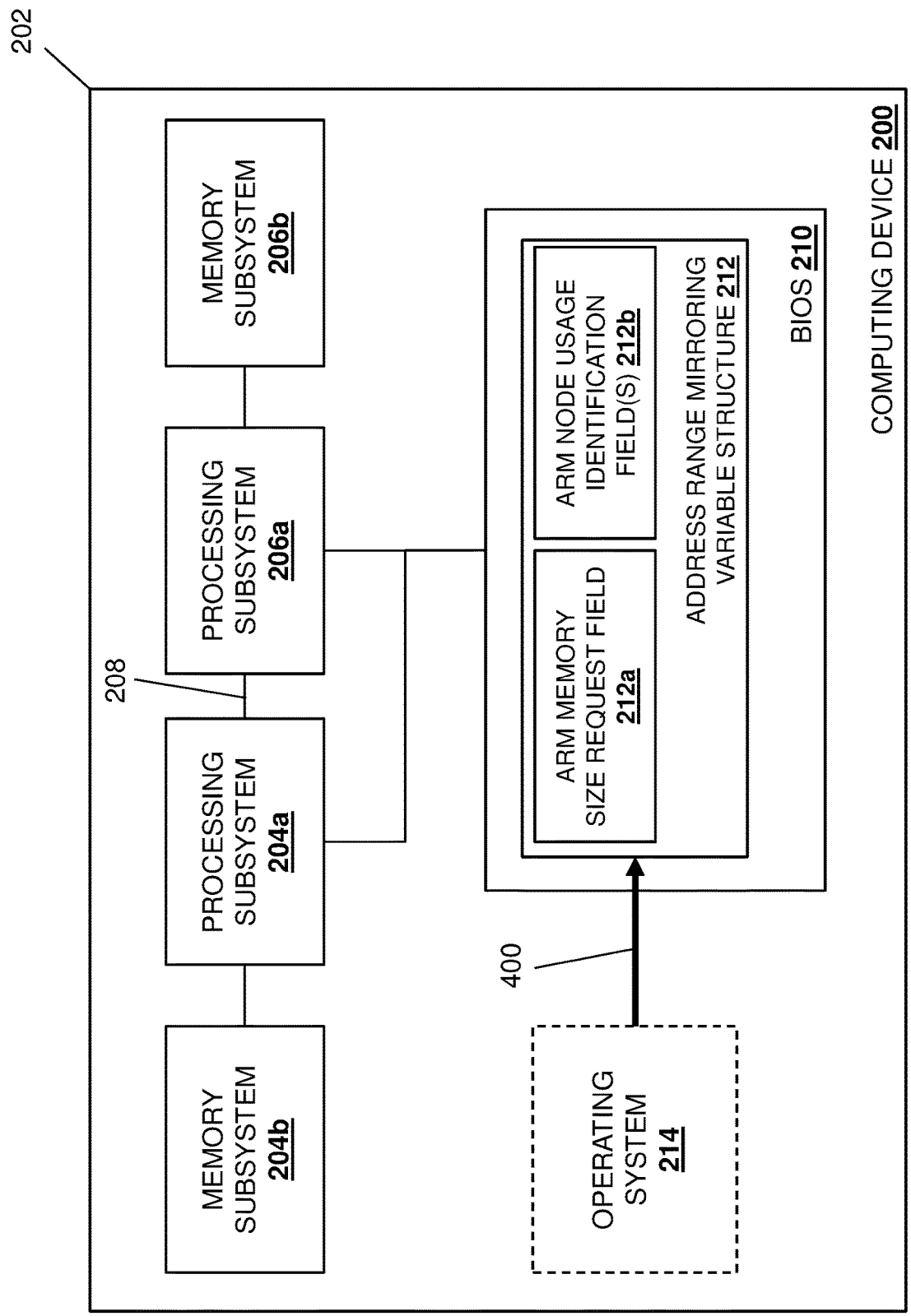
FIG. 4 is a schematic view illustrating an embodiment of the computing device 200 of FIG. 2 operating during the method of FIG. 3.

The method 300 begins at block 302 where an operating system requests address range mirroring. With reference to FIG. 4, in an embodiment of block 302, the operating system 214 may operate to perform address range mirroring request operations 400 in order to request address range mirroring. In an embodiment, during runtime operations for the computing device 200, the operating system 214 may perform the address range mirroring request operations 400 that include providing an address range mirroring memory size in the Address Range Mirroring (ARM) memory size field 212a included in the address range mirroring variable structure 212, and providing an address range mirroring node usage identifier in one or more of the Address Range Mirroring (ARM) node usage identification field(s) 212b included in the address range mirroring variable structure 212. In a specific example, the operating system 214 may require a particular memory size (e.g., 200 GB in the examples provided below) for address range mirroring of operating system kernel memory data, user-defined high priority data, and/or any other data that would be apparent to one of skill in the art in possession of the present disclosure, and at block 302 the operating system 214 may provide that memory size in the Address Range Mirroring (ARM) memory size field 212a as part of the address range mirroring request operations 400.

Figure 5:
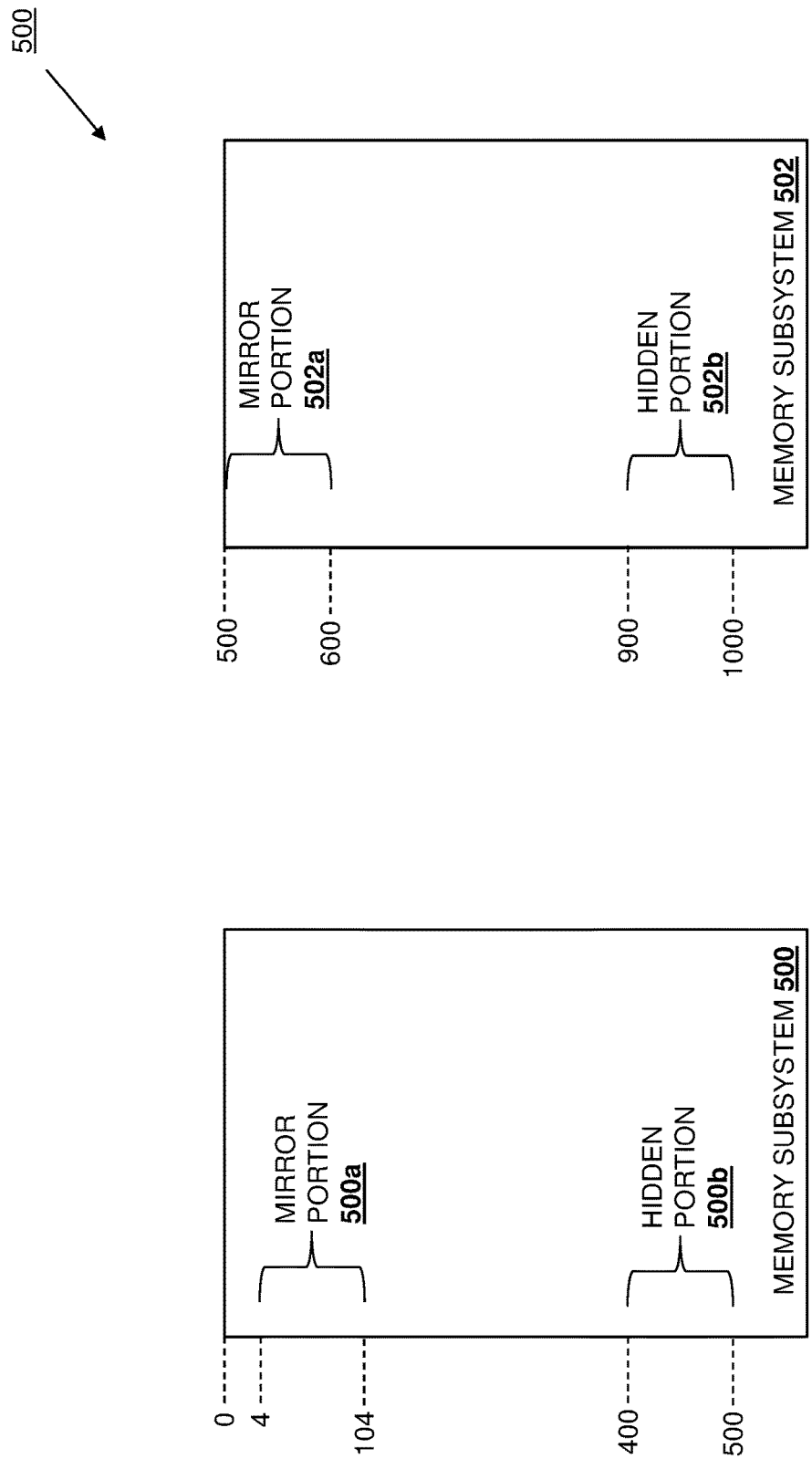
FIG. 5 is a schematic view illustrating an embodiment of a conventional address range mirroring configuration provided via conventional address range mirroring operations.

With reference to FIG. 5, an embodiment of a conventional multi-processing subsystem/memory subsystem node address range mirroring configuration in a two processing subsystem/memory subsystem node system (e.g., a two NUMA node system) is illustrated to contrast the multi-processing subsystem/memory subsystem node address range mirroring configuration operations of the present disclosure. In this example, an operating system may have requested a memory size of 200 GB for address range mirroring (e.g., by providing a UEFI variable in an address range mirroring UEFI variable structure) and, in response, a BIOS has operated to configure a memory subsystem 500 that is part of a first processing subsystem/memory subsystem node and that includes 500 GB of memory space (illustrated as 0-500 in FIG. 5), and a memory subsystem 502 that is part of a second processing subsystem/memory subsystem node that includes 500 GB of memory space (illustrated as 500-1000 in FIG. 5).

As can be seen, the conventional address range mirroring configuration operations include configuring a 100 GB mirror portion 500a of the memory subsystem 500 between 4 GB and 104 GB in the memory subsystem 500, a 100 GB hidden portion 500b of the memory subsystem 500 between 400 GB and 500 GB in the memory subsystem 502, a 100 GB mirror portion 502a of the memory subsystem 502 between 500 GB and 600 GB in the memory subsystem 502, and a 100 GB hidden portion 502b of the memory subsystem 502 between 900 GB and 1000 GB in the memory subsystem 502. As will be appreciated by one of skill in the art in possession of the present disclosure, the operating system will view the combined memory system provided by the memory subsystems 500a and 502 as including the 100 GB mirror portion 500a as being provided between 4 GB and 104 GB in the combined memory system, will not be able to see the 100 GB hidden portion 500b, will view the 100 GB mirror portion 502a as being provided between 400 GB and 500 GB in the combined memory system (i.e., because the 400 GB-500 GB portion of the memory subsystem 500 is hidden from the operating system), will not be able to see the 100 GB hidden portion 502b. In other words, the 100 GB hidden portions 500b and 502b will cause the operating system to view the combined memory system (provided by the memory subsystems 500a and 502 that have a combined 1000 GB of memory space) as having 800 GB of memory space.

As will be appreciated by one of skill in the art in possession of the present disclosure, the BIOS may then inform the operating system of the mirror portions 500a and 500b and, subsequently, any data provided on the mirror portion 500a by the operating system will be automatically copied to the hidden portion 500b (e.g., by the processing system), while any data provided on the mirror portion 502a by the operating system will be automatically copied to the hidden portion 502b (e.g., by the processing system). Thus, the 200 GB address range mirroring request will result in 200 GB of address range mirroring provided via the 100 GB mirror portion 500a and the 100 GB hidden portion 500b on the memory subsystem 500, and 200 GB of address range mirroring provided via the 100 GB mirror portion 502a and the 100 GB hidden portion 502b on the memory subsystem 502. Furthermore, one of skill in the art in possession of the present disclosure will recognize that in processing subsystem/memory subsystem node systems with additional processing subsystem/memory subsystem nodes, 200 GB of address range mirroring will be provided (via a respective 100 GB mirror portion and a 100 GB hidden portion) on the memory subsystem in each of the additional processing subsystem/memory subsystem nodes as well. As discussed above, there may be situations where it is desirable to conserve memory space and not provide address range mirroring on one or more of the processing subsystem/memory subsystem nodes in a multi-processing subsystem/memory subsystem node system.

As discussed in further detail below, the address range mirroring system of the present disclosure addresses such issues via the Address Range Mirroring (ARM) node usage identification field(s) 212b in the address range mirroring variable structure 212. For example, the Address Range Mirroring (ARM) node usage identification field(s) 212b may be provided via an update to UEFI variables for address range mirroring by performing, for example, a modification to Memory Reference Code (MRC) to add the Address Range Mirroring (ARM) node usage identification field(s) 212b to the Address Range Mirroring (ARM) UEFI viable structure. In an embodiment, at block 302, the operating system 214 may use the Address Range Mirroring (ARM) node usage identification field(s) 212b to identify a number of processing subsystem/memory subsystem nodes upon which address range mirroring should be configured. Using the example of the two processing subsystem/memory subsystem node system illustrated in FIG. 2, at block 302 the operating system 214 may set a flag or provide a UEFI variable in the Address Range Mirroring (ARM) node usage identification field(s) 212b to identify that only one of the processing subsystem 204a/memory subsystem 204b node and the processing subsystem 206a/memory subsystem 206b node should be configured for address range mirroring. However, while a specific example of a two processing subsystem/memory subsystem node system is provided, one of skill in the art in possession of the present disclosure will appreciate how the Address Range Mirroring (ARM) node usage identification field(s) 212b in the address range mirroring variable structure 212 may allow processing subsystem/memory subsystem node systems with more processing subsystem/memory subsystem nodes to have different subsets of those processing subsystem/memory subsystem nodes configured for address range mirroring.

For example, in a three processing subsystem/memory subsystem node system, the operating system 214 may utilize the Address Range Mirroring (ARM) node usage identification field(s) 212b in the address range mirroring variable structure 212 to identify (e.g., via flags, identification data, and/or in any other manner that would be apparent to one of skill in the art in possession of the present disclosure) a first of the three processing subsystem/memory subsystem nodes for address range mirroring configuration, a first and second of the three processing subsystem/memory subsystem nodes for address range mirroring configuration, a first and third of the three processing subsystem/memory subsystem nodes for address range mirroring configuration, a second of the three processing subsystem/memory subsystem nodes for address range mirroring configuration, a second and third of the three processing subsystem/memory subsystem nodes for address range mirroring configuration, or a third of the three processing subsystem/memory subsystem nodes for address range mirroring configuration. Similarly, one of skill in the art in possession of the present disclosure will appreciate how the operating system 214 may utilize the Address Range Mirroring (ARM) node usage identification field(s) 212b in the address range mirroring variable structure 212 to identify any subset of processing subsystem/memory subsystem nodes in a four processing subsystem/memory subsystem node system for address range mirroring configuration as well, and how the teachings of the present disclosure may extend to processing subsystem/memory subsystem node systems with any number of processing subsystem/memory subsystem nodes.

The method 300 then proceeds to block 304 where a BIOS identifies an address range mirroring memory size and an address range mirroring node usage identification in the address range mirroring request. In an embodiment, at block 304 and following the request for address range mirroring by the operating system 214 at block 302, the BIOS engine in the BIOS 210 may operate to identify the address range mirroring memory size and address range mirroring node usage identification provided by the operating system 214 in that address range mirroring request. For example, following the request for address range mirroring by the operating system 214 at block 302, at block 304 the computing device 200 may be reset, rebooted, and/or otherwise initialized such that boot operations and/or other initialization operations are performed by the BIOS 210. As part of those initialization operations, the BIOS engine in the BIOS 210 may access the address range mirroring variable structure 212 and identify the address range mirroring memory size provided by the operating system 214 in the Address Range Mirroring (ARM) memory size request field 212*a* (e.g., 200 GB in the example above), and the address range mirroring node usage identifier(s) provided by the operating system 214 in the Address Range Mirroring (ARM) node usage identification field(s) 212*b* (e.g., the flag set for the two processing subsystem/memory subsystem node system in the example above). However, while the identification of particular data for the address range mirroring memory size and the address range mirroring node usage identifier at a particular time has been discussed, one of skill in the art in possession of the present disclosure will recognize that other data may be used to identify the address range mirroring memory size and/or the address range mirroring node usage identifier at other times (e.g., during runtime operations for the computing device 200) while remaining within the scope of the present disclosure.

Figure 6A:
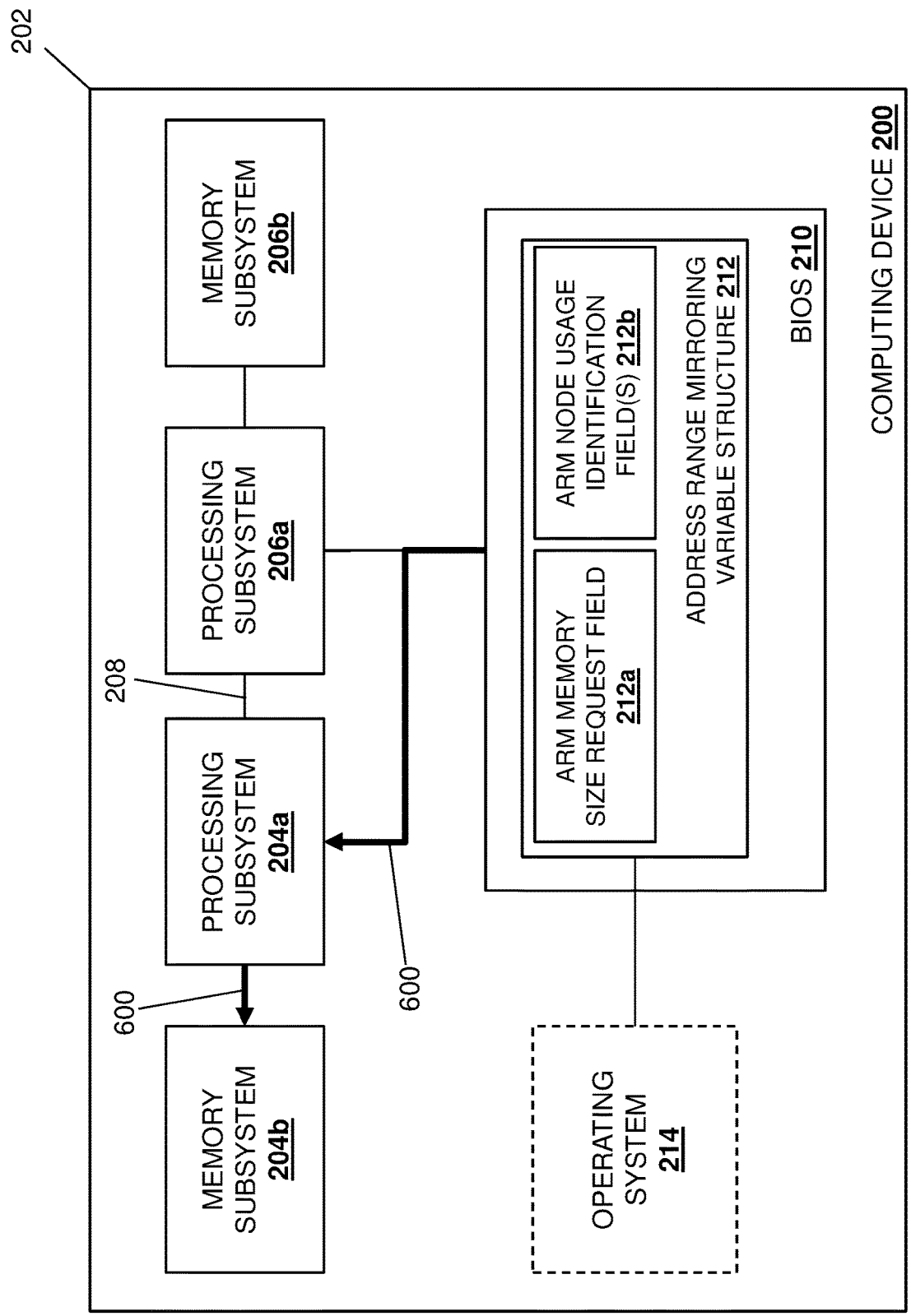
FIG. 6A is a schematic view illustrating an embodiment of the computing device 200 of FIG. 2 operating during the method of FIG. 3.

The method 300 then proceeds to block 306 where the BIOS configures address range mirroring in a subset of processing subsystem/memory subsystem nodes based on the address range mirroring memory size and address range mirroring node usage identification. With reference to FIG. 6A, an embodiment of block 306 is illustrated in which the address range mirroring node usage identifier(s) provided by the operating system 214 in the Address Range Mirroring (ARM) node usage identification field(s) 212*b* (e.g., a flag set for the two processing subsystem/memory subsystem node system) identifies that only one of the processing subsystem 204*a*/memory subsystem 204*b* node and the processing subsystem 206*a*/memory subsystem 206*b* node should be configured for address range mirroring and, in response, the BIOS engine in the BIOS 210 may operate to perform address range configuration operations 600 on the memory subsystem 204*b* in the "first" processing subsystem 204*a*/memory subsystem 204*b* node.

Figure 6B:
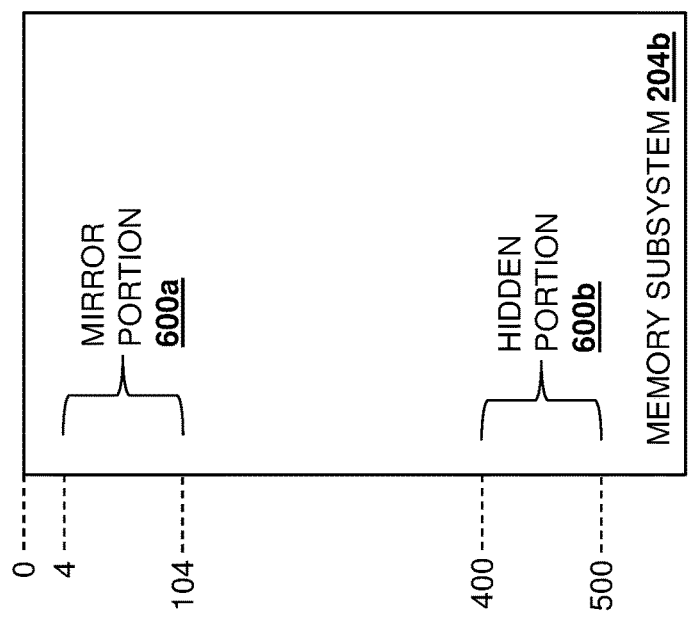
FIG. 6B is a schematic view illustrating an embodiment of a address range mirroring configuration provided via address range mirroring operations performed according to the teachings of the present disclosure.
Figure 6B:
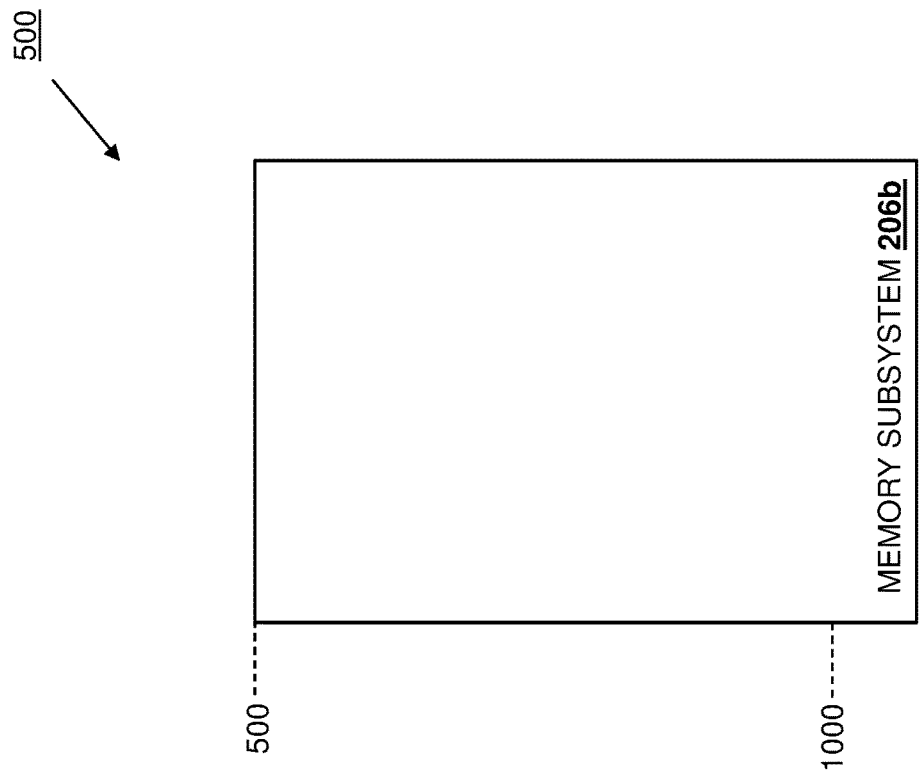

With reference to FIG. 6B, an embodiment of a multi-processing subsystem/memory subsystem node address range mirroring configuration that may be provided at block 306 in a two processing subsystem/memory subsystem node system (e.g., a two NUMA nodes system) is illustrated. In this example, the operating system 214 has requested a memory size of 200 GB for address range mirroring in the Address Range Mirroring (ARM) memory size request field 212*a* included in the address range mirroring variable structure 212, and has set a flag in the in Address Range Mirroring (ARM) node usage identification field(s) 212*b* in the address range mirroring variable structure 212 that identifies that only one of the processing subsystem 204*a*/memory subsystem 204*b* node and the processing subsystem 206*a*/memory subsystem 206*b* node should be configured for address range mirroring In response, the BIOS engine in the BIOS 210 has operated to configure the memory subsystem 204*a* that is part of the "first" processing subsystem 204*a*/memory subsystem 204*b* node and that includes 500 GB of memory space (illustrated as 0-500 in FIG. 5), while not configuring the memory subsystem 206*b* that is part of the "second" processing subsystem 206*a*/memory subsystem 206*b* node that includes 500 GB of memory space (illustrated as 500-1000 in FIG. 5).

As can be seen, the address range mirroring configuration operations 600 performed at block 306 include configuring a 200 GB mirror portion 600*a* of the memory subsystem 204*b* between 4 GB and 204 GB in the memory subsystem 204*b*, and configuring a 200 GB hidden portion 600*b* of the memory subsystem 204*b* between 300 GB and 500 GB in the memory subsystem 204*b*. As will be appreciated by one of skill in the art in possession of the present disclosure, the operating system 214 will view the combined memory system provided by the memory subsystems 206*b* and 206*b* as including the 200 GB mirror portion 600*a* that is provided between 4 GB and 204 GB in the combined memory system, and will not be able to see the 200 GB hidden portion 600*b*. In other words, the 200 GB hidden portion 600*b* will cause the operating system 214 to view the combined memory system (provided by the memory subsystems 204*b* and 206*b* that have a combined 1000 GB of memory space) as having 800 GB of memory space.

As discussed above, while a specific example of a two processing subsystem/memory subsystem node system is provided, one of skill in the art in possession of the present disclosure will appreciate how the Address Range Mirroring (ARM) node usage identification field(s) 212*b* in the address range mirroring variable structure 212 may allow processing subsystem/memory subsystem node systems with more processing subsystem/memory subsystem nodes to have different subsets of those processing subsystem/memory subsystem nodes configured for address range mirroring. As such, in a three processing subsystem/memory subsystem node system, at block 306 the BIOS engine in the BIOS 210 may configure a first of the three processing subsystem/memory subsystem nodes for address range mirroring, a first and second of the three processing subsystem/memory subsystem nodes for address range mirroring, a first and third of the three processing subsystem/memory subsystem nodes for address range mirroring, a second of the three processing subsystem/memory subsystem nodes for address range mirroring, a second and third of the three processing subsystem/memory subsystem nodes for address range mirroring, or a third of the three processing subsystem/memory subsystem nodes for address range mirroring. Similarly, one of skill in the art in possession of the present disclosure will appreciate how the BIOS engine in the BIOS 210 may configure any subset of processing subsystem/memory subsystem nodes in a four processing subsystem/memory subsystem node system for address range mirroring as well, and how the teachings of the present disclosure may extend to processing subsystem/memory subsystem node systems with any number of processing subsystem/memory subsystem nodes.

The method 300 then proceeds to block 308 where at least one of the processing subsystem/memory subsystem nodes performs address range mirroring in the subset of processing subsystem/memory subsystem nodes. In an embodiment, at block 308 and following the address range mirroring configuration operations by the BIOS 210, the initialization operations for the computing device 200 may be completed and the computing device 200 may enter a runtime state in which runtime operations are performed. As will be appreciated by one of skill in the art in possession of the present disclosure, following the address range mirroring configuration operations at block 306, the BIOS engine in the BIOS 210 may inform the operating system 214 of the mirror portion 600a in the memory subsystem 204a by, for example, updating a UEFI variable status field in order to report to the operating system 214 how the address range mirroring was configured at block 306.

Subsequently, any data provided (e.g., stored) on the mirror portion 600a of the memory subsystem 204b by the operating system 214 will be automatically copied to the hidden portion 600b in the memory subsystem 204b (e.g., by the processing subsystem 204a), thus "mirroring" that data that is stored on the mirror portion 600a in the hidden portion 600b. As such, the 200 GB address range mirroring request will result in 200 GB of address range mirroring provided via the 100 GB mirror portion 600a and the 100 GB hidden portion 600b on the memory subsystem 204b, while the memory subsystem 206b is not configured for address range mirroring such that all the memory space on the memory subsystem 206b is available for data storage. Furthermore, one of skill in the art in possession of the present disclosure will recognize that in processing subsystem/memory subsystem node systems with additional processing subsystem/memory subsystem nodes, 200 GB of address range mirroring may be provided (via a respective 100 GB mirror portion and a 100 GB hidden portion) on any memory subsystems in a subset of the processing subsystem/memory subsystem nodes that is less than the total number of processing subsystem/memory subsystem nodes. Finally, one of skill in the art in possession of the present disclosure will recognize how, in the event a mirror portion of a memory subsystem (e.g., mirror portion 600a on memory subsystem 204b) experiences an uncorrectable error or otherwise becomes unavailable, the copy of the data stored on the corresponding hidden portion of the memory subsystem (e.g., hidden portion 600b on the memory subsystem 204b) may be retrieved (e.g., by the processing subsystem 204a) for use by the operating system 214.

As will be appreciated by one of skill in the art in possession of the present disclosure, in the event no address range mirroring node usage identifier is provided in the Address Range Mirroring (ARM) node usage identification field(s) 212b in the address range mirroring variable structure 212, the conventional address range mirroring operations discussed above with reference to FIG. 5 may be performed by the BIOS 210. Furthermore, in the event the address range memory size provided by the operating system 214 in the Address Range Mirroring (ARM) memory size request field 212a in the address range mirroring variable structure 212 exceeds the size of a first memory subsystem that is identified for address range mirroring configuration (e.g., the memory subsystem 204a in the example above), the BIOS engine in the BIOS 210 may operate to configure that entire first memory subsystem for address range mirroring, and then configure a second memory subsystem (and additional memory subsystems if necessary) for address range mirroring in order to provide the requested address range mirroring memory size.

Thus, systems and methods have been described that provide for the modification of NUMA system address range mirroring operations by a BIOS that would conventionally operate to configure address range mirroring on the NUMA memory in each of the NUMA nodes in the NUMA system. For example, the address range mirroring system of the present disclosure may include a plurality of NUMA nodes, each of which include a respective NUMA processor coupled to a respective NUMA memory. An operating system is provided by at least one of the plurality of NUMA nodes, and a BIOS that is coupled to the plurality of NUMA nodes may identify an address range mirroring memory size and an address range mirroring node usage identification that was provided by the operating system. In response, the BIOS will configure address range mirroring according to the address range mirroring memory size in the respective NUMA memory in each of a subset of the plurality of NUMA nodes, with the subset of the plurality of NUMA nodes based on the address range mirroring node usage identification. As such, the number NUMA nodes in a NUMA system upon which address range mirroring is configured may be modified such that address range mirroring is performed on less than all of the NUMA nodes in the NUMA system, allowing for the conservation of memory resources in situations where address range mirroring is not required on all of the NUMA nodes.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An address range mirroring system, comprising:
a plurality of discrete memory subsystems; and
an address range mirroring configuration subsystem that is coupled to the plurality of discrete memory subsystems and configured to:
identify an address range mirroring memory size;
identify a subset of the plurality of discrete memory subsystems for address range mirroring configuration; and
configure, in each of the subset of the plurality of discrete memory subsystems identified for address range mirroring configuration, address range mirroring according to the address range mirroring memory size.

2. The system of claim 1, wherein identifying the address range mirroring memory size and the subset of the plurality of discrete memory subsystems for address range mirroring configuration includes:
receiving, during a runtime operations for a computing device that includes the plurality of discrete memory subsystems, the address range mirroring memory size and the subset of the plurality of discrete memory subsystems for address range mirroring configuration; and
identifying, as part of initialization operations for the computing device that are performed subsequent to the runtime operations, the address range mirroring memory size and the subset of the plurality of discrete memory subsystems for address range mirroring configuration that were received during the runtime operations for the computing device.

3. The system of claim 2, the address range mirroring memory size and the subset of the plurality of discrete memory subsystems for address range mirroring configuration are received in an address range mirroring variable structure during the runtime operations for the computing device.

4. The system of claim 3, wherein the address range mirroring variable structure includes Memory Reference Code (MRC) that is configured to store an identification of the subset of the plurality of discrete memory subsystems for address range mirroring configuration.

5. The system of claim 1, wherein the configuring the address range mirroring according to the address range mirroring memory size in each of the subset of the plurality of discrete memory subsystems identified for address range mirroring configuration includes:
configuring a first portion of the subset of the plurality of discrete memory subsystems as mirrored memory; and
configuring a second portion of the subset of the plurality of discrete memory subsystems as hidden memory.

6. The system of claim 5, wherein data provided in the first portion of the subset of the plurality of discrete memory subsystems that was configured as mirrored memory is automatically copied to the second portion of the subset of the plurality of discrete memory subsystems that was configured as hidden memory.

7. The system of claim 1, further comprising:
a plurality of processing subsystems, wherein each of the plurality of processing subsystems is configured to utilize a respective one of the plurality of discrete memory subsystems as a local memory subsystem.

8. An Information Handling System (IHS), comprising:
a first processing system; and
a first memory system that is coupled to the first processing system and that includes instructions that, when executed by the first processing system, cause the first processing system to provide an address range mirroring configuration engine that is configured to:
identify an address range mirroring memory size;
identify a subset of a plurality of discrete second memory subsystems for address range mirroring configuration; and
configure, in each of the subset of the plurality of discrete second memory subsystems identified for address range mirroring configuration, address range mirroring according to the address range mirroring memory size.

9. The IHS of claim 8, wherein identifying the address range mirroring memory size and the subset of the plurality of discrete second memory subsystems for address range mirroring configuration includes:
receiving, during a runtime operations for the IHS, the address range mirroring memory size and the subset of the plurality of discrete second memory subsystems for address range mirroring configuration; and
identifying, as part of initialization operations for the IHS that are performed subsequent to the runtime operations, the address range mirroring memory size and the subset of the plurality of discrete second memory subsystems for address range mirroring configuration that were received during the runtime operations for the IHS.

10. The IHS of claim 9, wherein the address range mirroring memory size and the subset of the plurality of discrete second memory subsystems for address range mirroring configuration are received in an address range mirroring variable structure during the runtime operations for the IHS.

11. The IHS of claim 10, wherein the address range mirroring variable structure includes Memory Reference Code (MRC) that is configured to store an identification of the subset of the plurality of discrete second memory subsystems for address range mirroring configuration.

12. The IHS of claim 8, wherein the configuring the address range mirroring according to the address range mirroring memory size in each of the subset of the plurality of discrete second memory subsystems identified for address range mirroring configuration includes:
configuring a first portion of the subset of the plurality of discrete second memory subsystems as mirrored memory; and
configuring a second portion of the subset of the plurality of discrete second memory subsystems as hidden memory.

13. The IHS of claim 12, wherein data provided in the first portion of the subset of the plurality of discrete second memory subsystems that was configured as mirrored memory is automatically copied to the second portion of the subset of the plurality of discrete second memory subsystems that was configured as hidden memory.

14. A method for performing address range mirroring, comprising:
identifying, by an address range mirroring configuration subsystem, an address range mirroring memory size;
identifying, by the address range mirroring configuration subsystem, a subset of a plurality of discrete memory subsystems for address range mirroring configuration; and
configuring, by the address range mirroring configuration subsystem in each of the subset of the plurality of discrete memory subsystems identified for address range mirroring configuration, address range mirroring according to the address range mirroring memory size.

15. The method of claim 14, wherein identifying the address range mirroring memory size and the subset of the plurality of discrete memory subsystems for address range mirroring configuration includes:
receiving, by the address range mirroring configuration subsystem during a runtime operations for a computing device that includes the plurality of discrete memory subsystems, the address range mirroring memory size and the subset of the plurality of discrete memory subsystems for address range mirroring configuration; and
identifying, by the address range mirroring configuration subsystem as part of initialization operations for the computing device that are performed subsequent to the runtime operations, the address range mirroring memory size and the subset of the plurality of discrete memory subsystems for address range mirroring configuration that were received during the runtime operations for the computing device.

16. The method of claim 15, wherein the address range mirroring memory size and the subset of the plurality of discrete memory subsystems for address range mirroring configuration are received in an address range mirroring variable structure during the runtime operations for the computing device.

17. The method of claim 16, wherein the address range mirroring variable structure includes Memory Reference Code (MRC) that is configured to store an identification of the subset of the plurality of discrete memory subsystems for address range mirroring configuration.

18. The method of claim 14, wherein the configuring the address range mirroring according to the address range mirroring memory size in each of the subset of the plurality of discrete memory subsystems identified for address range mirroring configuration includes:
- configuring, by the address range mirroring configuration subsystem, a first portion of the subset of the plurality of discrete memory subsystems as mirrored memory; and
- configuring, by the address range mirroring configuration subsystem, a second portion of the subset of the plurality of discrete memory subsystems as hidden memory.

19. The method of claim 18, wherein data provided in the first portion of the subset of the plurality of discrete memory subsystems that was configured as mirrored memory is automatically copied to the second portion of the subset of the plurality of discrete memory subsystems that was configured as hidden memory.

20. The method of claim 14, further comprising:
- utilizing, by each of a plurality of processing subsystems, a respective one of the plurality of discrete memory subsystems as a local memory subsystem.

* * * * *

UNITED STATES PATENT AND TRADEMARK OFFICE
CERTIFICATE OF CORRECTION

| | | |
|---|---|---|
| PATENT NO. | : 11,748,111 B2 | Page 1 of 1 |
| APPLICATION NO. | : 17/589737 | |
| DATED | : September 5, 2023 | |
| INVENTOR(S) | : Chao et al. | |

It is certified that error appears in the above-identified patent and that said Letters Patent is hereby corrected as shown below:

On the Title Page

Item (54), should read as follows:
--BASIC INPUT OUTPUT SYSTEM (BIOS) - IDENTIFIED MEMORY SIZE AND NODE ADDRESS RANGE MIRRORING SYSTEM--

In the Specification

Column 1, Lines 1-4, should read as follows:
--BASIC INPUT OUTPUT SYSTEM (BIOS) - IDENTIFIED MEMORY SIZE AND NODE ADDRESS RANGE MIRRORING SYSTEM--

Signed and Sealed this
Thirty-first Day of October, 2023

Katherine Kelly Vidal
*Director of the United States Patent and Trademark Office*